United States Patent [19]

Paugstat et al.

[11] 4,232,375
[45] Nov. 4, 1980

[54] DATA COMPRESSION SYSTEM AND APPARATUS

[75] Inventors: John F. Paugstat, Salesville; Donald J. Girard, Cambridge, both of Ohio

[73] Assignee: NCR Corporation, Dayton, Ohio

[21] Appl. No.: 914,821

[22] Filed: Jun. 12, 1978

[51] Int. Cl.³ .................. G06F 7/20; G06F 7/34; G06F/5/00; H03K 13/00
[52] U.S. Cl. .................. 364/900; 340/347 DD
[58] Field of Search .......... 364/900 MS File, 200 MS File; 340/347 DD; 235/310

[56] References Cited

U.S. PATENT DOCUMENTS

| | | | |
|---|---|---|---|
| 3,311,893 | 3/1967 | Landell | 364/900 |
| 3,501,750 | 3/1970 | Webb | 364/900 |
| 3,535,696 | 10/1970 | Webb | 364/200 |
| 3,717,851 | 2/1973 | Cocke et al. | 364/200 |
| 3,772,654 | 11/1973 | Evans et al. | 364/200 |
| 3,936,808 | 2/1976 | O'Neill, Jr. | 364/900 |
| 3,976,844 | 8/1976 | Betz | 364/900 |
| 4,021,782 | 5/1977 | Haerning | 364/900 |
| 4,031,515 | 6/1977 | Kashio | 364/900 |
| 4,034,350 | 7/1977 | Kashio | 364/900 |
| 4,145,686 | 3/1979 | McMurray et al. | 340/347 DD |

Primary Examiner—Gareth D. Shaw
Assistant Examiner—E. Chan
Attorney, Agent, or Firm—J. T. Cavender; Wilbert Hawk, Jr.; Richard W. Lavin

[57] ABSTRACT

A system and apparatus for compressing a binary data message generated by a digital input device is disclosed wherein a data message generated in a data terminal device as part of a merchandise transaction is examined on the basis of information content with all data relating to redundant information previously generated or known being deleted together with encoding of preselected portions of the non-redundant data results in the compression of the data to a minimum amount without losing the informational content of the original data thereby allowing the compressed data to be stored in a relatively small storage unit located in the data terminal device. A compressed data record is generated including an encoded start of record character which may signify, in addition to the start of the compressed data record, the type of merchandise transaction being processed. Other non-redundant data which can be determined by knowing the corresponding data of a previous data message are also deleted with only that data required in order to reconstruct the original data generated being retained in the storage unit.

12 Claims, 25 Drawing Figures

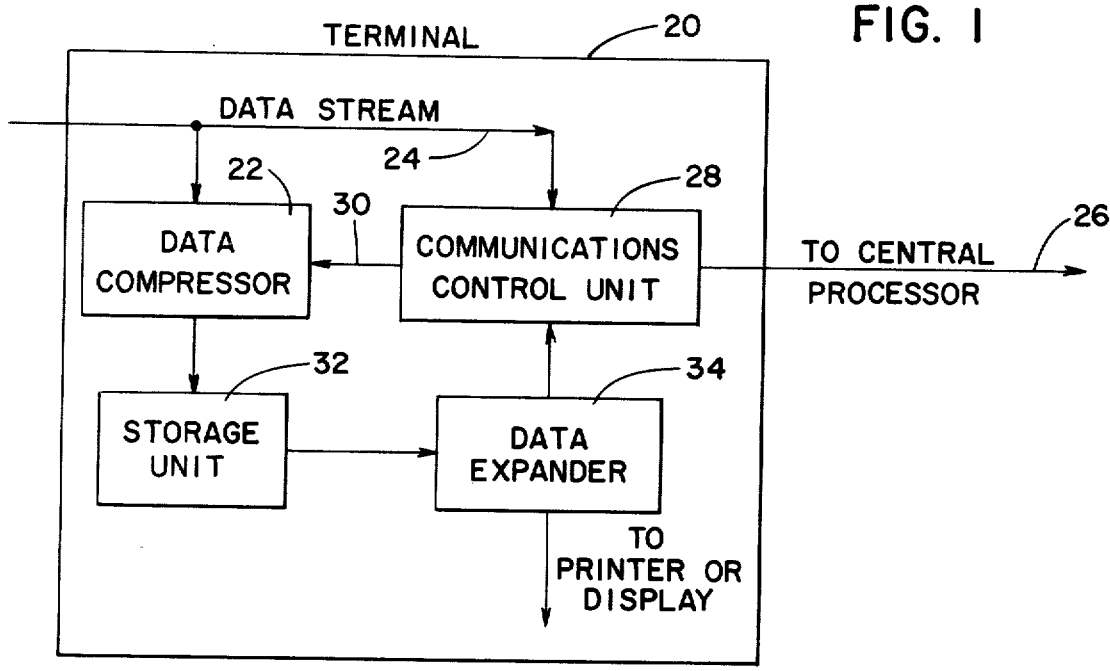
FIG. 1
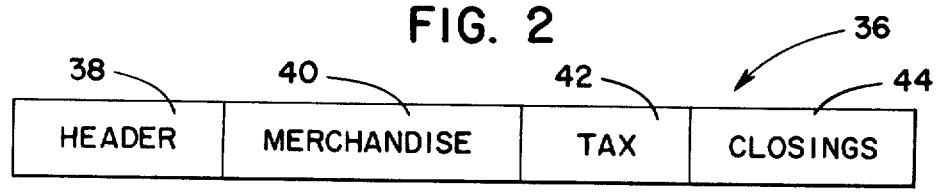
FIG. 2
FIG. 3
| HEADER | | | | | | | | | |
|---|---|---|---|---|---|---|---|---|---|
| 00 | MSG CNT | 00 | STORE NO | TERM NO | TRAN CNT | MEDIA | QUAL CODE | SEQ CODE | OP ID | D |
FIG. 4
| MERCHANDISE | | | | | | | | | | | | | |
|---|---|---|---|---|---|---|---|---|---|---|---|---|---|
| FORMAT | | DEPT | F | CLASS | F | SKU | F | QTY | F | PRICE | F | ITEM CODE | E |
FIG. 5
| TAX | | | | | |
|---|---|---|---|---|---|
| TAX CODE | E | 9 | F | TAX AMOUNT | E |
FIG. 6
| CLOSINGS CASH | | | |
|---|---|---|---|
| D | TOTAL | E | C |

FIG. 7

| HEADER | IC | 00 | MSG CNT | C0 | STORE | TERM | TRAN | MEDIA | QUAL CODE | SEQ | OPR ID | ID | TOTAL BITS |
|---|---|---|---|---|---|---|---|---|---|---|---|---|---|
| # BYTES | 1 | 1 | 1 | 1 | 2 | 2 | 2 | 2 | 1 | 1 | 1 | 1 | 176 |
| MI6 COUNT | 1 | 2 | 3 | 4 | 6 | 8 | 10 | 12 | 13 | 14 | 7 | 0 | 0 |
|  | ⇐ | ⇐ | ⇐ | ⇐ | ⇐ | ⇐ | ⇐ | ⇐ | ⇐ | ⇐ | ⇐ | ⇐ |  |

FIG. 8

| COMPRESSED RECORD | SOT$_A$ OR SOT$_B$ | ELECTRONIC JOURNAL CODE | OPR ID | EOR$_F$ | 46 |
|---|---|---|---|---|---|
| # BITS | 4 | 0 OR 8 | 0 OR 4 | 4 | 8 TO 20 |
|  | 47 | 49 | 51 | 53 |  |

FIG. 12

| QUAL CODE (83) | EJ CODE (85) | SOTA (87) | SOTB (89) |
|---|---|---|---|
| 01 | 80 | X | |
| 20 | 01 | X | |
| 30 | 02 | X | |
| 14 | 03 | X | |
| 08 | 06 | X | |
| 09 | 07 | X | |
| 12 | 08 | X | |
| 13 | 09 | X | |
| 42 | 11 | X | |
| 43 | 12 | X | |
| 44 | 13 | X | |
| 46 | 15 | X | |
| 47 | 21 | X | |
| 45 | 23 | X | |
| 03 | 80 | | X |
| 21 | 51 | | X |
| 31 | 52 | | X |
| 04 | 53 | | X |
| 22 | 54 | | X |
| 32 | 55 | | X |
| 05 | 56 | | X |
| 23 | 57 | | X |
| 33 | 58 | | X |
| 06 | 60 | | X |
| 26 | 61 | | X |
| 36 | 62 | | X |
| 07 | 63 | | X |
| 27 | 64 | | X |
| 37 | 65 | | X |
| 10 | 70 | | X |
| 11 | 71 | | X |

(80)

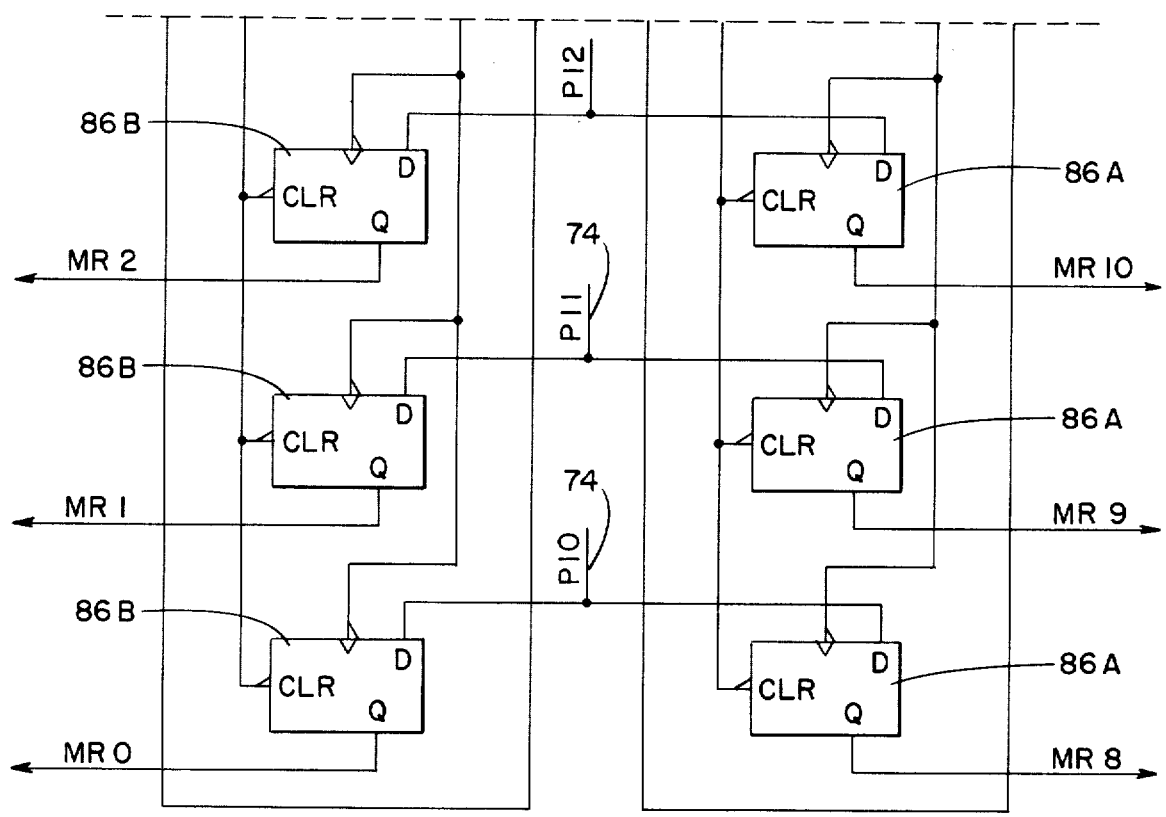
FIG. 17B
FIG. 16
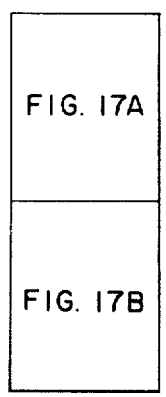

ced, the start of record character indicating the start of the compressed data record in addition to the transaction type when there is an absence of data in another portion of the compressed data record.

The invention will be better understood from the following detailed description of one preferred embodiment thereof with reference to the accompanying drawings.

DATA COMPRESSION SYSTEM AND APPARATUS

BACKGROUND OF THE INVENTION

The present invention relates generally to data compression and more particularly to an apparatus and method for reducing the number of bits in a block of data generated during the operation of a data terminal device or other type of input peripheral device without losing the informational content of the data. In modern day on-line merchandising systems, a plurality of data terminal devices are each connected to a shared central processing unit (CPU) or other type of data collector for transmission thereto of data generated by the thermal device for processing to provide a basis for inventory and other business controls. During those periods where the CPU or the communication network to the CPU is inoperative for any reason it is the present practice to terminate the terminal operation or to provide a hard copy at the terminal from which the data can be recovered and transmitted to the CPU upon the recovery of the CPU to an operating condition. To insure the capture of data during periods when the CPU is inoperative, the hard copy backup operation is maintained as a normal part of the terminal operation when the CPU is operational. This requirement becomes an appreciative cost of terminal operations. In order to overcome this problem, it has been suggested that each data terminal include a memory unit to store the data generated during the time the CPU is disabled. Unfortunately, the data to be stored under these conditions can be so expensive as to make the in-terminal storage prohibitively expensive. This problem has been recognized in the prior art in which various methods and apparatuses have been devised to reduce the data in order to store it economically. For example, in U.S. Pat. No. 4,021,782, the data is compacted by varying the length and number base of the data. In U.S. Pat. Nos. 3,694,813, 3,717,851 and 3,925,780, data processing techniques using variable length codes to encode data in order to reduce the amount of data are disclosed. Since all of these techniques are directed to a central processor operations, their use in a stand-alone data terminal device would not be economically feasible. It is therefore a primary object of this invention to provide a low-cost data compression apparatus capable of reducing the amount of data generated in a data terminal device as the result of a plurality of merchandising operations sufficient to allow the terminal device to store the data without losing any transactional detail.

SUMMARY OF THE INVENTION

In order to carry out this object, there is disclosed a data compression apparatus for use in a data terminal device which outputs data to a CPU, the unit includes means for storing portions of a first data message generated by the terminal device as the result of a merchandising transaction performed during the time the CPU is disabled, counter means for deleting all redundant data characters of each data message, means for comparing preselected data characters of each succeeding data message with the corresponding data characters of the first data message stored in the terminal device for deleting those data characters when a comparison is found, and table look-up means for selecting a start of record character in accordance with a data character representing the type of data transaction being pro-

BRIEF DESCRIPTION OF THE DRAWINGS

FIG. 1 is a block diagram which incorporates the present invention showing only those logic elements involved with the transmission of data from the terminal to the central processing unit (CPU).

FIG. 2 is a block diagram illustrating the functional portions of a typical data message generated as the result of one type of merchandise transaction.

FIG. 3 is a diagram illustrating the message format comprising the header portion of FIG. 2.

FIG. 4 is a diagram illustrating the message format comprising the merchandise portion of FIG. 2.

FIG. 5 is a diagram illustrating the message format comprising the tax portion of FIG. 2.

FIG. 6 is a diagram illustrating the message format comprising the closing portion of FIG. 2.

FIG. 7 is a more detailed diagram of the message format comprising the header portion of FIG. 3 showing the number of binary bits contained within each field in the message format together with a corresponding count of the M16 counter prior to data compression.

FIG. 8 is a diagram of the compressed data record produced as the result of a compression operation of the header portion of FIG. 7.

FIG. 12 shows the table of the electronic journal codes, the Qual codes and their coded representation.

FIG. 14 illustrates the manner in which

FIGS. 15A and 15B taken together disclose a block diagram of the Sequencer shown in FIG. 9;

FIG. 16 illustrate the manner in which FIGS. 17A and 17B are to be arranged;

FIGS. 17A and 17B taken together form a block diagram of the Media register disclosed in FIG. 9;

DESCRIPTION OF THE PREFERRED EMBODIMENT

Figure 9:
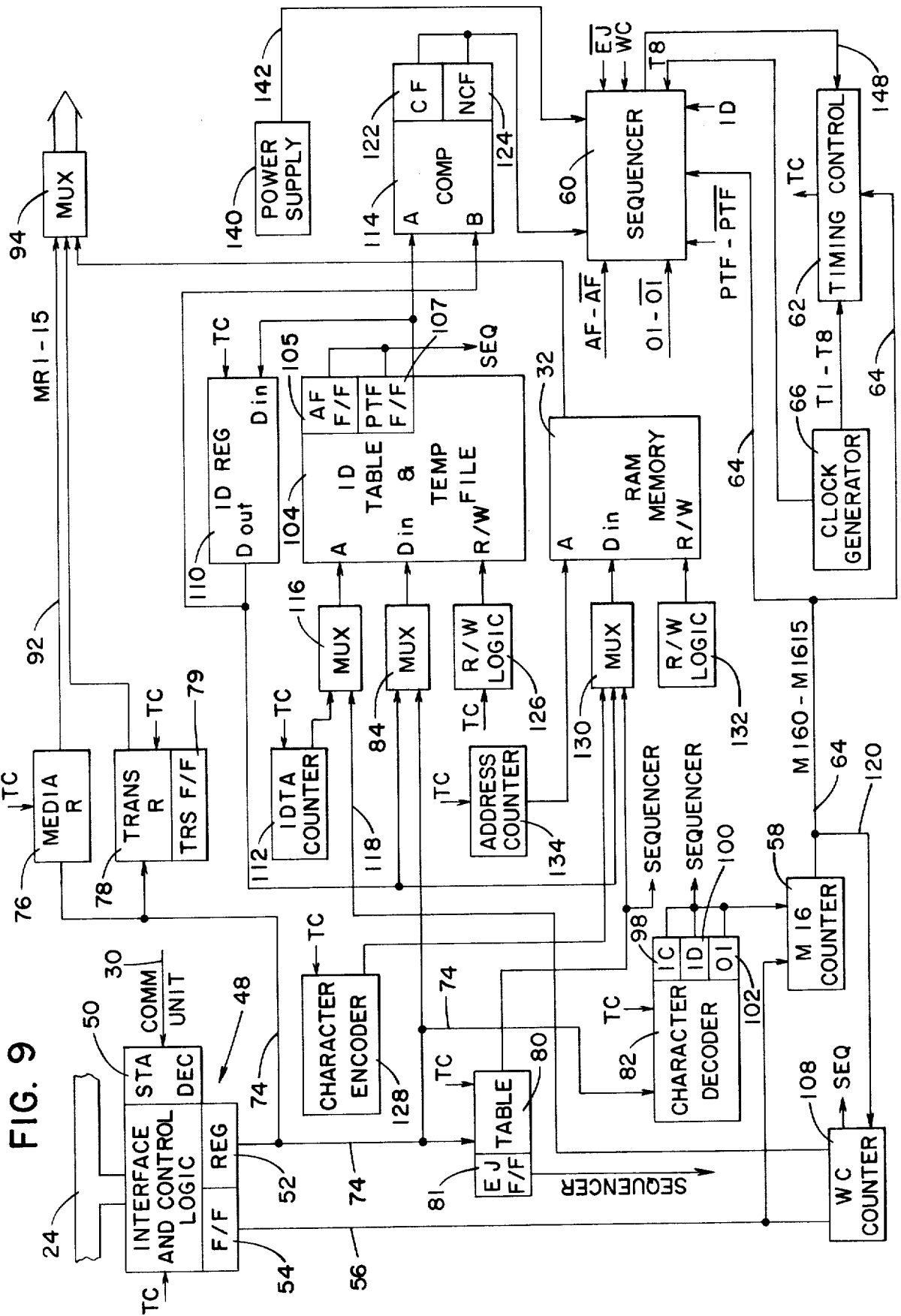
FIG. 9 is a detailed block diagram of the data compression unit.

Referring to FIG. 1, there is shown a block diagram of the data transmission system found within a data terminal device in which the present invention is utilized. Included in the data terminal device 20 is a data compressor 22 coupled to a communication bus 24 over which a stream of data bits is transmitted from the terminal 20 to a central processor (not shown) through a communication control unit 28 and over communication bus 26 in a manner that is well-known in the art.

When the central processor notifies the communication control unit 28 that is in a disabled condition, therefore unable to accept any further data from the terminal 20, the communication control unit 28 generates control signals over line 30 to the data compressor 22 notifying the compression of such a condition and enabling the compressor 22 to accept all data transmitted over bus 24.

After compressing the data received over bus 24, the data compressor 22 will transmit the compressed data to a RAM (random access memory) storage unit 32. When the central processor is again enabled to receive and process the data from the data terminal 20, the compressed data is transmitted from the storage unit 32 to a data expander 34 which expands the compressed data to its orignal form, the expanded data being displayed or printed and transmitted to the communication control unit 28 for transmission to the central processor over bus 26.

Referring now to FIGS. 2-8 inclusive, there is shown details of the blocks of data in the form of a message generated as a result of the operation of the data terminal 20 in a merchandise transaction. As diagrammed in FIG. 2, the format of a typical message 36 consists of a header portion 38 which defines the type of message that is being generated together with various types of housekeeping data required to identify the environment in which the message is being generated, a merchandise portion 40 which includes data pertinent to the identity of the merchandise purchased, a tax portion 42 and a closing portion 44 which includes a total of the merchandise purchased. While FIG. 2 is illustrative of a typical message format found in present-day merchandise transactions, it is obvious that other combinations of merchandise and non-merchandise portions can also be included.

Referring now to FIGS. 3-6 inclusive, there is shown in more detailed form the data included in the message 36 (FIG. 2). As shown in FIG. 3, the header portion 38 includes, starting at the left end of the message format, a control character 00; a message count MSG CNT which is a consecutive number; a second control character 00; the store number; the number of the data terminal 20 in which the data is generated; the transaction count which is a consecutive number identifying the transaction operation; a media count identifying the number of record slips generated; a Qual code which identifies the transaction as a cash, charge or other type of transaction; a sequential character identifying whether this is the only one or one of a number of transaction operations which make up a single overall transaction; the operator ID and a control character D indicating the end of the header portion.

The merchandise portion 40 of the message 36 is shown in FIG. 4 which includes a format character indicating the type of merchandise message format; a control character F which functions to separate the fields in the message format; the department number in which the transaction is being performed; a second control character F; the identification of the merchandise being purchased; a third control character F; a field-length character, SKU; the control character F, the quantity of merchandise being purchased; another control character F; the price of the merchandise being purchased; another control character F, an item code character indicating either a taxable or non-taxable transaction and a control character E indicating the end of the merchandise portion 40 of the message 36 (FIG. 2).

FIG. 5 discloses the tax portion 42 (FIG. 2) of the message 36, which portion includes a tax code which may indicate a special tax being applied on the merchandise purchased; a number of control separator characters E, 9, and F the amount of tax applied to the merchandise purchased; and a control character E indicating the end of the taxed portion 42. FIG. 6 illustrates the closing portion 44 (FIG. 2) of the message 36 which includes the control characters D, E and C, the latter indicating the end of the message 36; and the total amount of the merchandised items purchased and which are described in the merchandise portion 40 of the message 36. If more than one type of merchandise item is purchased during this transaction operation, it is obvious that the message 36 will include a merchandise portion 40 and a tax portion 42 for each type of merchandise item purchased, the total amount in the closing portion 44 will then reflect the total amount of all merchandise items purchased by the customer.

In the present embodiment, the data compressor 22 (FIG. 1), upon receiving the message 36 (FIG. 2), will remove all information which is static or basic to the system during a specified time period. Thus, the date, the store number, the terminal number, and the format characters, the latter in the merchandise portion 40, will be removed. The data compressor 22 will also remove all information which is the same or common to a previous transaction message if a positive association can always be made. An example of this type of operation is found in the operator ID and the type of transaction being performed. The data compressor 22 will also remove information which has a fixed relationship to a previous transaction message. An example of this is the transaction number which is always one more than the previous transaction number. The data compressor will also remove all information which can have an assumed value; it will record only if the information is different than the fixed assumed value. Examples of this type of data compression involve the quantity of merchandise items purchased which is assumed to be one, the type of transaction being performed and format control. The data compressor 22 will also abbreviate where appropriate. An example of this is in the operator ID where only the most significant bits of data are retained.

The data compressor 22 will further remove information which is calculable from base information already collected. An example of this can be found in the transaction totals located in the closing portion 44 (FIG. 2) of the message 36 and the tax amounts which are found in the tax portion 42 of the message 36 (FIG. 2) based on the purchased amounts. Thus, in processing the message 36 (FIG. 2), the tax portion 42 and the closing portion 44 may be dropped. Other areas in which the data compressor 22 can reduce data include system redundant information and information not required to the desired end result. An example of the former may be found in the item price field in the merchandise portion 40 (FIG. 4); since the item code is known, the price can be found in price look-up tables if they are available. An example of the latter type of information concerns "no sales" transactions. In all of these situations, if the information is an exception to these rules, the data will be retained. Using these procedures, it has been found that the data compressor 22 of the present embodiment can effect an overall data reduction of 5 to 1.

Referring now to FIG. 7 there is shown a detailed diagram of the format of the header portion 38 of the message 36 (FIG. 2) showing the number of 8-bit bytes of data assigned to each field in the message portion together with the output count of a 16-stage 4-bit binary counter found in the data compressor 22 and used to keep track of the character position in the header portion being received by the compressor 22. FIG. 8 shows the compressed data record 46 of the header portion 38 (FIG. 7) after being compressed by the data compressor 22. As indicated, the header portion is reduced from 176 binary bits to a possible 8 to 20 binary bits. Since the header portion 38 (FIG. 2) contains a greater amount of data that can be compressed than the merchandise portion 40, the explanation of the operation of the data compressor 22 will be limited to the header portion 38 (FIG. 2) of the message 36 recognizing that a similar operation utilizing the same compression apparatus can be applied to the merchandise portion 40.

As shown in FIG. 7, the header portion 38 of the message 36 includes, in addition to the fields described previously with respect to FIG. 3, an initial control character IC which indicates the start of the message 36. Comparing the message formats of FIG. 7 and FIG. 8, it will be seen that the compressed data record 46 consists of a format control character field 47, containing either a 4-bit format character $SOT_A$ or $SOT_B$, each indicating the start of a transaction message. In the case of a string of character fields 47 where $SOT_A$ or $SOT_B$ may fall therein, it is implied that the format control character located therein terminates the last transaction message and starts the next transaction message. The next field 49 in the compressed data record 46 is entitled electronic journal code representing the Qual code found in the header message 38 (FIG. 7), which code can be either 0 or 8 bits long. As will be described more fully hereinafter, if the electronic journal code field 49 is 0 bits and the format control character is an $SOT_A$, it is then assumed that the Qual code and the format code (found in the merchandise portion 40, FIG. 4) will represent a cash transaction together with a standard merchandise format. If the format control character is $SOT_B$, it will then assume that the transaction is a standard "charge" transaction with a standard merchandise format. If the electronic journal code consists of a predetermined 4-bit character together with a $SOT_A$, then it will be assumed that the transaction is a "cash" transaction; a "charge" transaction is implied if the control character is $SOT_B$. The format code will be specified by a single 4-bit character located in the electronic journal code field. If the transaction code is other than a (cash) or (charge), the electronic journal code field 49 will contain the specific two 4-bit characters specifying the code. In a typical merchandising operation, there may be up to 30 different transaction codes.

Referring again to FIG. 8, the compressed data record 46 which is stored in the RAM storage unit 32 (FIG. 1) contain an operator ID field 51 in which may be recorded 0 bits indicating that the operator is the same as in the previous header portion 38, or a 4-bit character, indicating the specific operator ID. The record 46 is completed with the generation of a 4-bit record separator character $EOR_F$ located in the record separator field 53 indicating the end of the compressed data record if a merchandise field is to follow. If a new header portion 38 is to start, one of the format control characters $SOT_A$ or $SOT_B$ will be stored in the field 53. As will be described more fully hereinafter, the total number of bits found in the compressed data record 46 provide an indication as to whether new data pertaining to the operator I.D. or the electronic journal code or to both is present.

Referring now to FIG. 9 there is shown the logic of the data compressor 22 (FIG. 1) for compressing data received serially in a bit-by-bit format from the transmission bus 24 (FIG. 1). Included in the data compressor 22 is a bus monitor unit 48 including the necessary interface and control logic to properly interface the data compressor to the system terminal communication bus 24. The bus monitor 48 also includes a status decoder 50 connected to the communication control unit 28 (FIG. 1) over line 30 for receiving signals indicating whether the central processor is capable of receiving data from the terminal 20. The bus monitor 48 also includes an 8-bit register 52 for storing an 8-bit character received from the communication bus 24 and an interrupt flip-flop 54 which outputs an interrupt signal INT upon the storing of an 8-bit character in the register 52.

Figure 10:
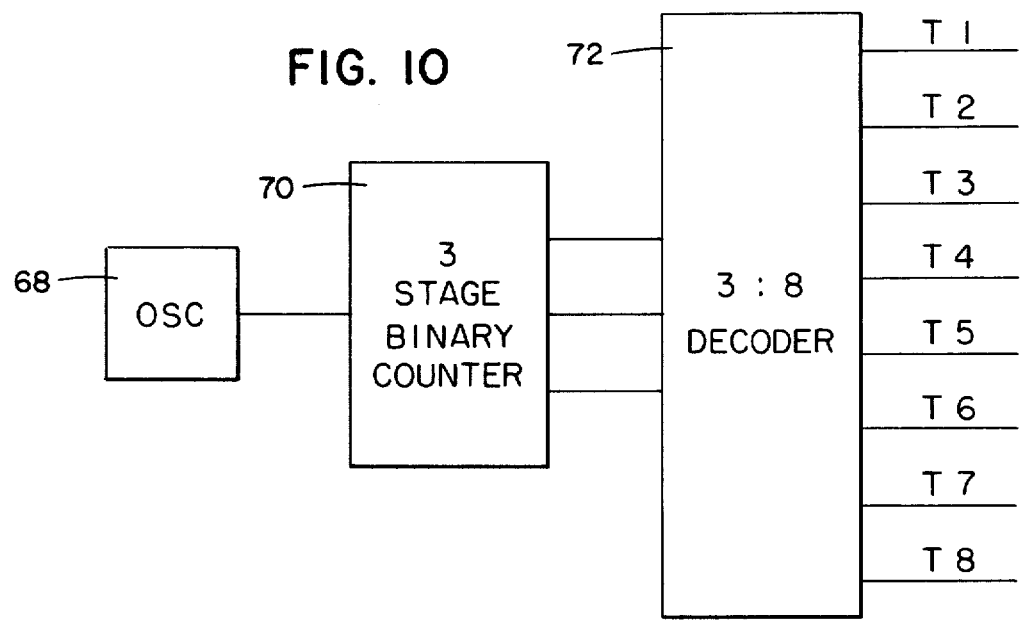
FIG. 10 is a block diagram of the clock generator disclosed in FIG. 9.
Figure 11:
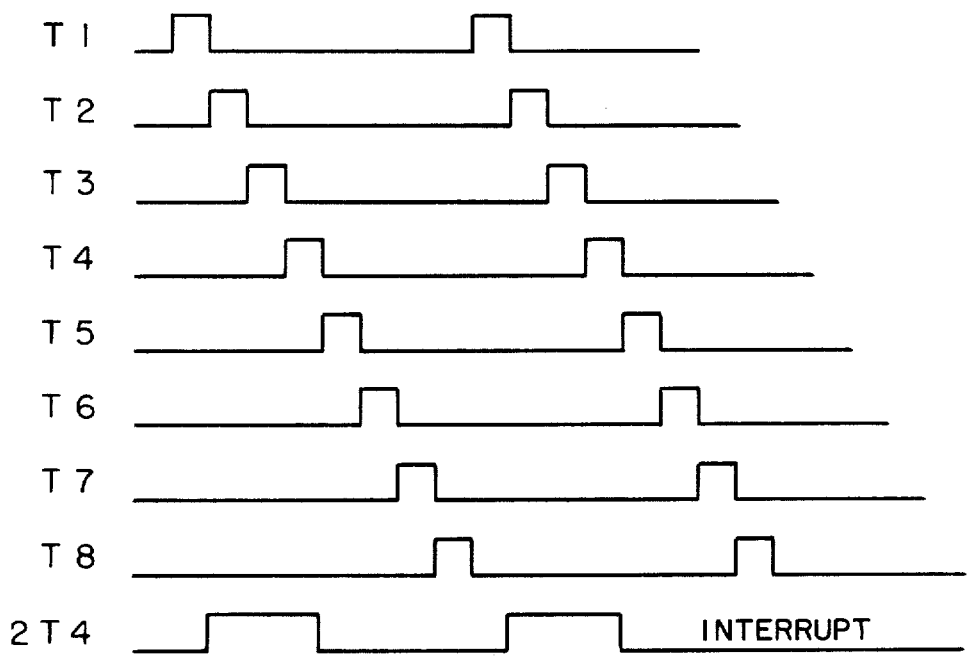
FIG. 11 shows the waveform of the clock pulses generated by the clock generator of FIG. 10.

The interrupt signal INT is outputted over line 56 from the flip-flop 54 to a 16-stage (4-bit binary) M16 counter 58 (FIG. 9) which is used to keep track of the position of each character in the header portion 38 of the message 36 as being received by the bus monitor 48. The counter 58 essentially counts the number of interrupt signals generated by the flip-flop 54 and is enabled upon the sensing of a valid message 36 by a character decoder 82. The output counts M16-0-M16-15 of counter 58 are outputted to a sequencer 60 and a timing control logic unit 62 for controlling the various operations of the data compressor. As shown in FIG. 7, the output counts of the M16 counter 58 occur after the character or characters in each field of the header portion 38 have been inputted into the register 52. For example, after the SEQ character has been loaded into the register 52 resulting in the outputting of an interrupt signal from the flip-flop 54, the M16 counter 58 will output count 14 designated as M16-14 over line 64 to the sequencer 60 and the timing control 62 unit, the latter outputting a control signal TC for initiating a logic operation of the data compressor at this time. The timing control 62 receives a series of clock pulses T1-T8 from a clock generator 66 (FIG. 9). As shown in FIG. 10, the clock generator 66 comprises an oscillator 68 outputting a series of clock pulses to a three-stage binary counter 70 whose output is fed into a 3 to 8 decoder 72 which outputs the clock pulses T1-T8. The waveform of these clock pulses are shown in FIG. 11 which also includes the interrupt pulse INT outputted from the flip-flop 54 which occurs from T1-T4 clock time if the decoder 50 indicates the CPU is disabled and an 8-bit character is ready in register 52.

Figure 17A:
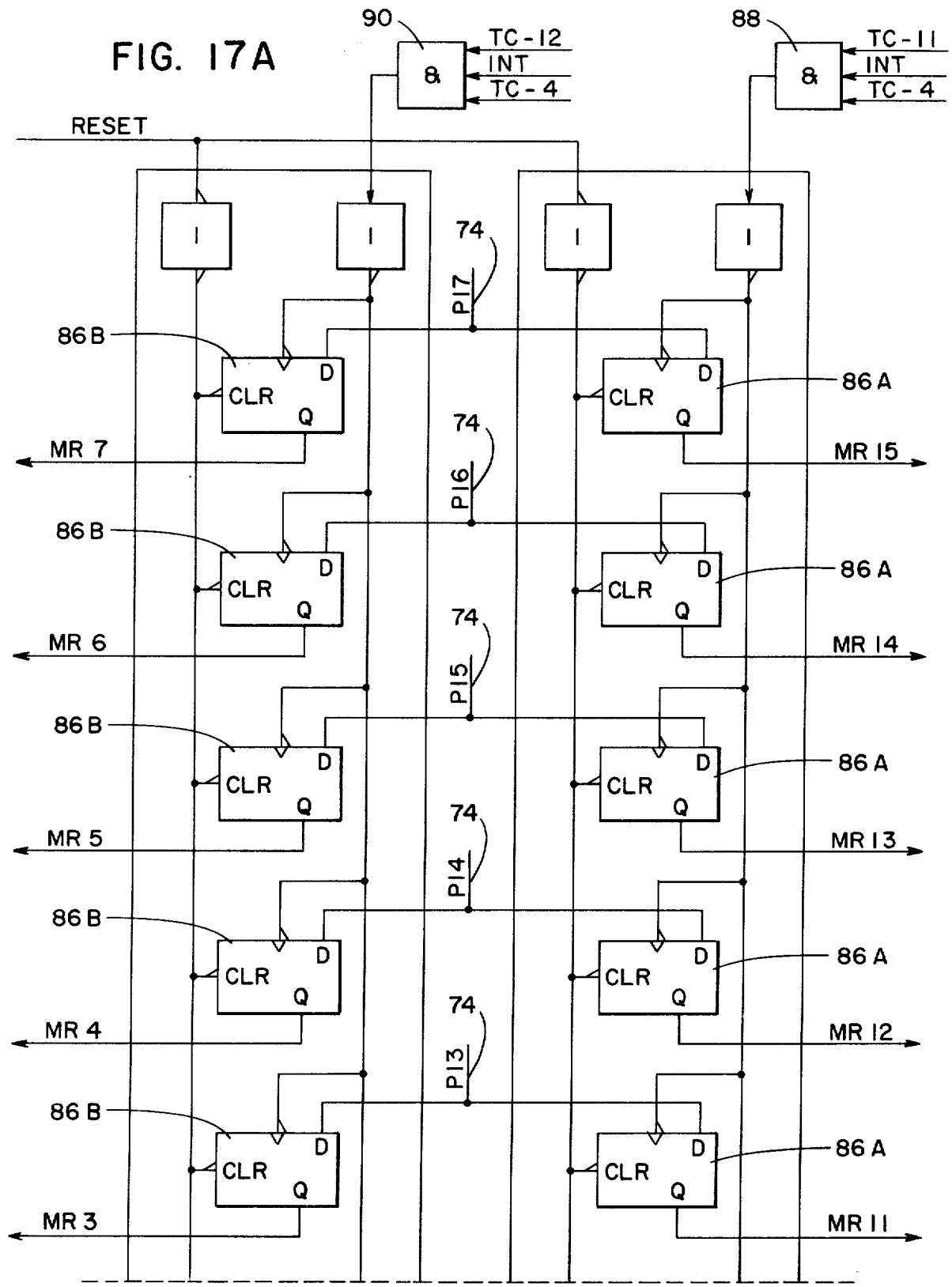

In response to the generation of the interrupt signal INT, the 8-bit character stored in the register 52 is outputted in parallel, under the control of the timing control unit 62, over cable 74 to a media register 76, a transaction register 78, an electronics journal (EJ) table 80, a character decoder 82 and a multiplexer 84. The media register 76 is shown in more detailed form in FIG. 17A and 17B, and is a 16-bit parallel in-parallel out register in which the media count or data (FIG. 7) from the most current header portion 38 (FIGS. 2 and 7) being compressed is stored. As shown in FIGS. 17A and 17B, the character bits indicated as P10-P17, are inputted over cable 74 to a series of flip-flops 86A and 86B for storage therein. As further shown in FIG. 7, the media data comprises two characters of information. After the first character has been loaded into the register 52, the flip-flop 54 will output the interrupt signal INT over line 56 resulting in the M16 counter 58 outputting the count M16-11. This signal will appear as timing control signal TC-11 (FIG. 17A) which, together with the interrupt signal INT and a second timing control signal TC-4 generated in the sequencer 60, are fed to an AND gate 88 which enables the first character of the media data to be loaded into the flip-flops 86A. The same condition occurs when the second character of the media data is loaded into the register 52 and the M16 counter outputs the count M16-12 as a result of the generation of the interrupt signal from the flip-flop 54. Since the media data of the last message 36 compressed by the data compressor 22 is the only media data required prior to the time the central processor is enabled to accept data from the terminal device, the data stored in the media register 76 will be outputted at the appropriate time over cable 92 containing 16 conductors to a multiplexer 94 for subsequent transmission to the data expander 34 (FIG. 1).

The transaction register 78 (FIG. 9) is a 16-bit parellel in-parallel out register similar in construction to that of the media register 76 and in which the transaction number of the first compressed header is stored. Since the transaction number of each succeeding message is one more than the previous compressed message, by storing the transaction number of the first compressed header in the transaction register 78, the data expander 34 (FIG. 1) can recreate the transaction number of each succeeding compressed message stored in the storage media 32 (FIG. 1) by adding one to the previous transaction number. The transaction register 78 includes a flip-flop 79 which when set upon the storing of the first transaction number will prevent the entry of any succeeding transaction number until reset upon the ending of a compression operation.

The electronics journal (EJ) table 80 (FIG. 9) comprises a storage unit and associated programmable logic arrays including the EJ flip-flop 81 for outputting an electronics journal code for the Qual code (FIG. 7) located in the header portion 38 (FIG. 2). The configuration of the EJ table is shown in more detail in FIG. 12 in which the various Qual codes found in a merchandising operation are listed in column 83 with their corresponding EJ code (column 85) together with a corresponding format control character $SOT_A$ (column 87) and $SOT_B$ (column 89). The Qual code defines the type of transaction which is involved in the current terminal operation. Thus, if the Qual code is 01, the transaction is a cash transaction. If the Qual code is 03, the transaction is a charge transaction. Since 90% of all the transactions comprise either of these two types of transaction codes, the storing of the character $SOT_A$ in the field 47 (FIG. 8) of the compressed data record 46 together with no bits in the electronics journal code field 49 indicates that it is a cash transaction. If the format control character stored is an $SOT_B$, the combination indicates that the transaction will be a charge transaction. If the Qual code is other than these two Qual codes, 01 or 03, the specific 8-bit electronics journal code listed (column 85) in FIG. 12 will be stored in the electronic journal code field 49 in the compressed data record 46 (FIG. 8) allowing the data expander 34 (FIG. 1) to reconstruct from the compressed data record 46 the original Qual code of the data message 36. The storing of one of the characters $SOT_A$ or $SOT_B$ in the field 49 of the compressed data record 46 (FIG. 8), also notifies the data expander 34 the start of a compressed data message, thereby eliminating the need for storing control characters such as 1C and 1D in the position shown in the header portion 38 in FIG. 7.

The character decoder 82 (FIG. 9) continuously monitors the output of the register 54 for the occurrence of characters 01, 1C or 1D. The character 1C indicates the start of the header portion 38 while 1D indicates the end of the header portion. The character 01 is found in the message count field (MSG CNT) (FIG. 7) indicating that it is the first message of a number of messages concerned with the same merchandise transaction being performed by the data terminal device 20 (FIG. 1). Included in the character decoder 82 is an IC flip-flop 98 which when set will output a pulse to initiate the operation of the binary counter 58, an ID flip-flop 100, and an 01 flip-flop 102, whose outputs are transmitted to the sequencer 60 and the M16 counter 58 (FIG. 9).

The output of the shift register 52 in the Bus Monitor 48 is also transmitted through the multiplexer 84 to an ID table 104 in which the operator ID of the current header 38 is compared with the previous operator IDs stored in the table to determine if the operator ID of the current header portion 38 is the same as the operator ID of the previous message. If it is the same, the operator ID field in the compressed data record (FIG. 8) will contain no bits, which notifies the data expander 34 that the operator ID of the current compressed data record is the same as that of the previous compressed data record. If the operator ID is not the same as the previous operator ID, four bits of data identifying the current operator ID will be stored in the compressed data record 46 and in the ID table 104. The ID table 104 is a 256×8 static RAM memory unit which is used to store the operator ID characters read from the header portion 38 and also a corresponding 4-bit character which is to be stored in the compressed data record (FIG. 8). The use of a 4-bit ID character allows (for up to) sixteen unique operator ID characters which is sufficient to cover this area of the merchandising operation.

Figure 13:
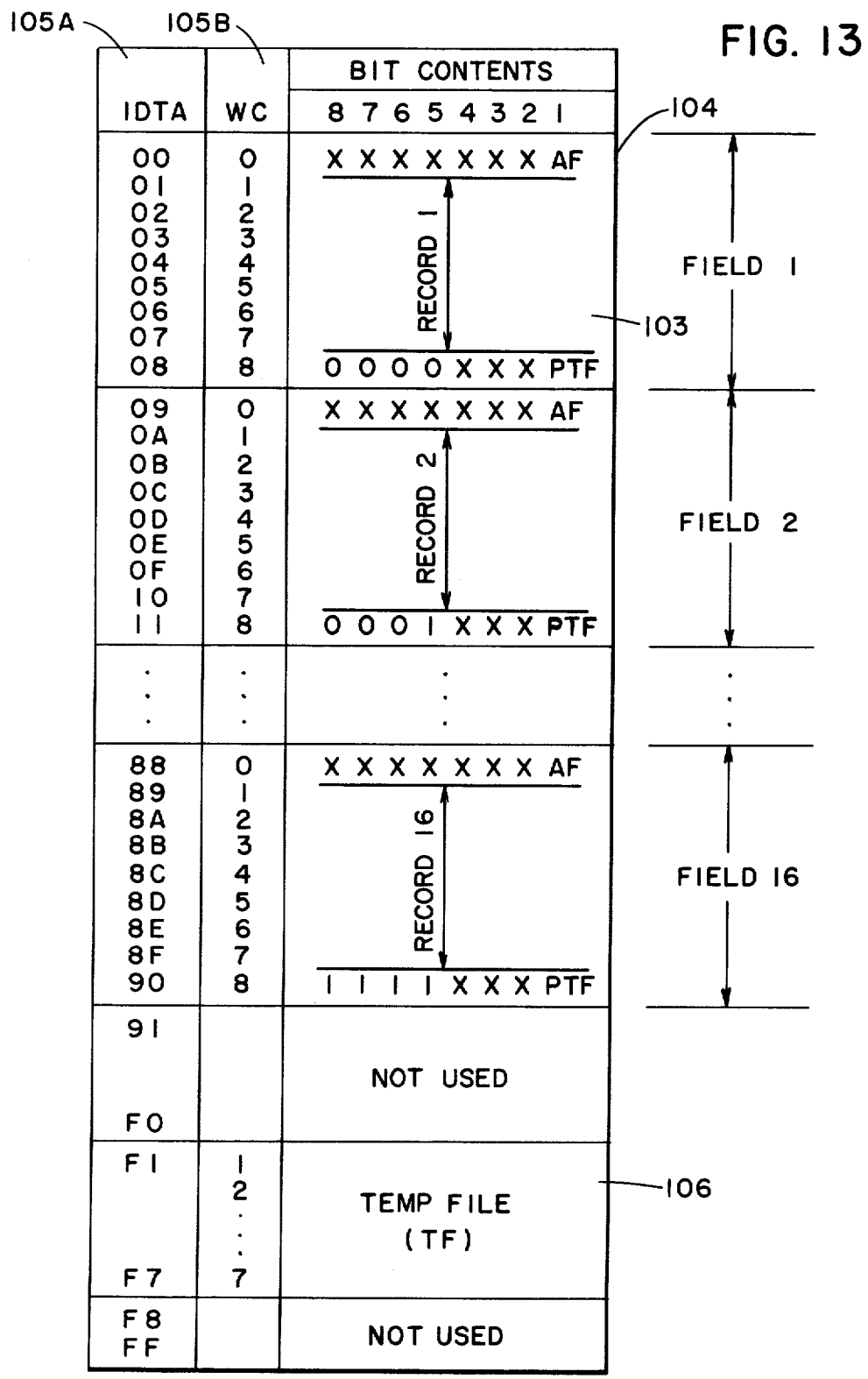
FIG. 13 shows the construction of the ID table located in the data compression unit of FIG. 9.

As shown in more detail in FIG. 13, the ID table 104 includes a plurality of storage fields to accommodate sixteen records 103, each field includes an AF flip-flop 105 (FIG. 9) indicating the storage of an operator ID in that field and a PTF flip-flop 107 indicating the last field in which an operator ID is stored, the record 103 comprising eight bytes of data wherein each byte is equivalent of two 4-bit characters. Also included in the ID table is a temporary file portion 106 in which the seven operator ID characters from the header portion 38 being currently processed are stored. Associated with the ID table 104 is a WC (Word) counter 108, an ID register 110, a ID TA counter 112 and a comparator unit 114. The WC counter 108 is a 4-bit binary counter which supplies the word address (column 105) (FIG. 13) of the operator ID characters stored in the temporary file 106 and for the storage of the operator ID in the ID table 104. The counter 108 is operated by the interrupt signal INT generated over line 56 from the flip-flop 54 and outputs its count to the sequencer 60 and also to a multiplexer 116 over line 118 for transmission to the ID table 104. The counter 108 receives the output of the M16 counter 58 over line 120 for use in generating its output in a manner that is well-known in the art.

The ID register 110 (FIG. 9) is an 8-bit parallel in-parallel out register required for the temporary storage of data read out of the ID table 104 during the operation of comparing the operator ID of the current header portion 38 with the operator's ID stored in the ID table 104. The IDTA counter 112 is an 8-bit binary address counter which generates the address, (column 105A) (FIG. 13) together with the output of the WC counter 108 (column 105B) (FIG. 13) for accessing the ID table 104. The comparator 114 compares eight bits of data representing the current operator ID stored in the temporary file 106 (FIG. 13) against eight bits representing a previous operator ID originally stored in the ID table 104, and which are now buffered in the ID register 110. The comparator 114 includes a CF flip-flop 122 which outputs signals CF, $\overline{CF}$ to the sequencer 60 upon finding a coincidence between the operator ID stored in the ID register 110 and the last operator ID character stored in the ID table 104. If a comparison is not found, a NCF flip-flop 124 is set, generating a signal to the sequencer 60 resulting in the timing control logic 62 generating the appropriate control signals TC to a read/write logic unit 126 which will write in the current operator ID characters in the ID table 104.

Other elements included in the data compressor logic include a character encoder 128 which outputs the correct bit configuration for the record separator character "EOR$_F$" which is the last character in the compressed data record 46 shown in FIG. 8, the character being transmitted through a multiplexer 130 for transmission of the character into the storage media 32, FIGS. 1 and 9. The storage unit 32 in the present embodiment may comprise a 1K × 4 static RAM memory which is used to store the compressed header records. Also inputted into the multiplexer 130 for storage in the storage unit 32 is the electronic journal code and its associated SOT character outputted from the EJ table 80 (FIG. 13) and the operator ID outputted from the ID register 110. The operation of the RAM memory unit 32 is under the control of a 10-bit binary address counter 134 which generates the address for accessing the RAM memory unit 32 in a manner that is well-known in the art. Also included in the data compressor 32 is a conventional power supply (FIG. 9) which outputs a pair of signals, power up and power down, over line 142 to the sequencer 60.

Figure 15B:
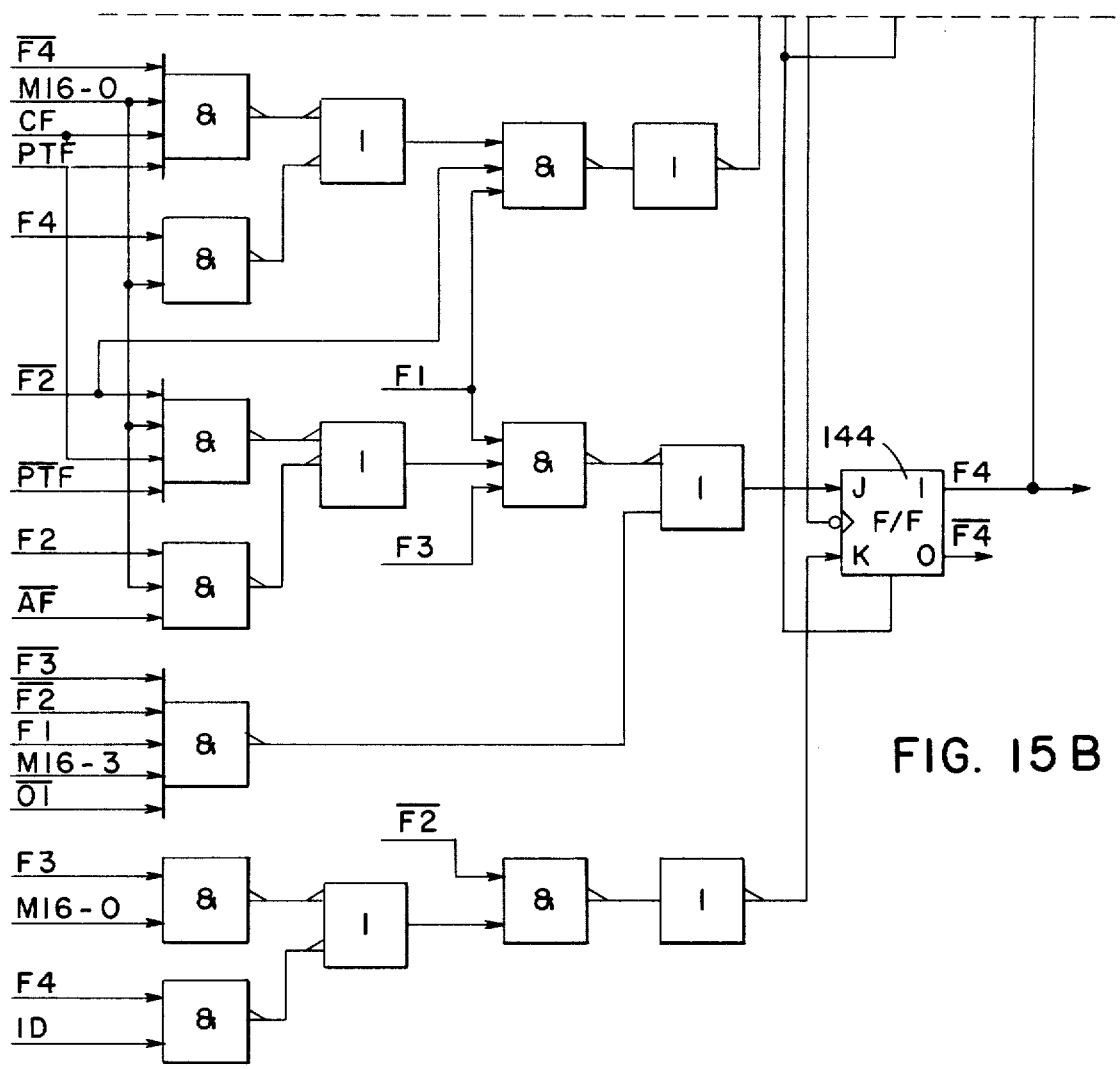
FIGS. 15A and 15B are to be arranged.
Figure 14:
Figure 15A:
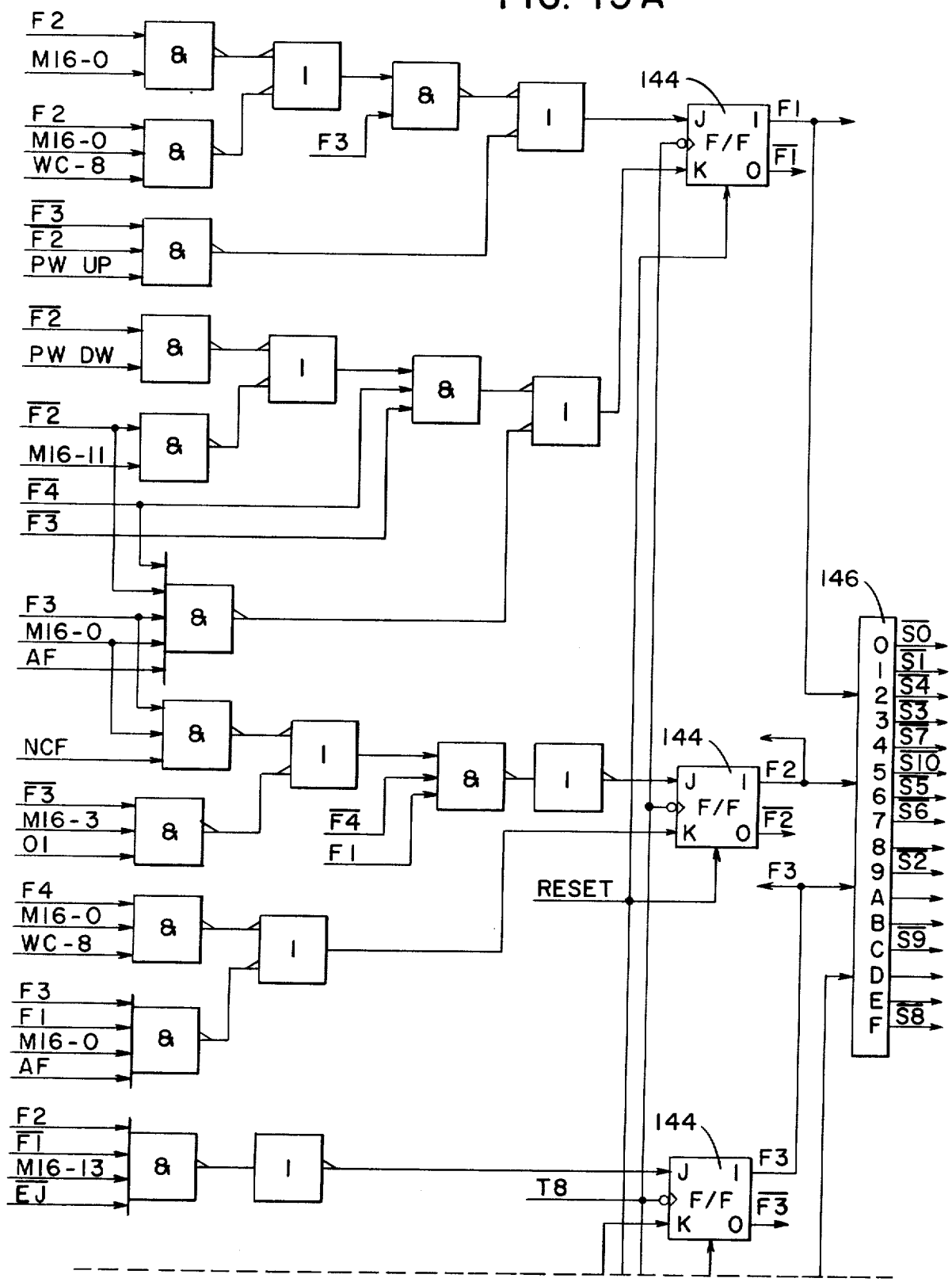
Figure 18A:
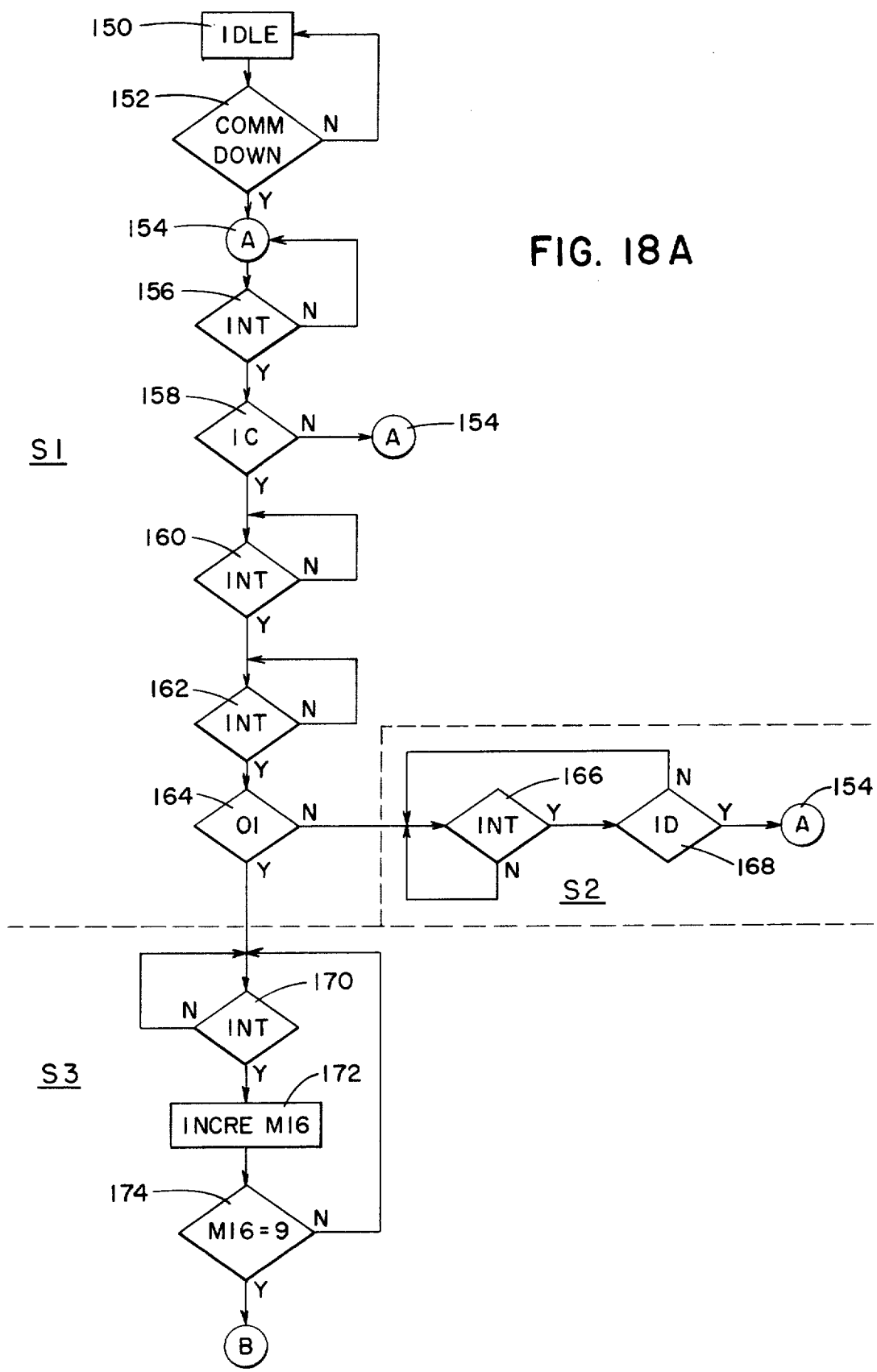
FIGS. 18A–18F taken together show in flow diagram form the operation of the preferred embodiment.
Figure 18B:
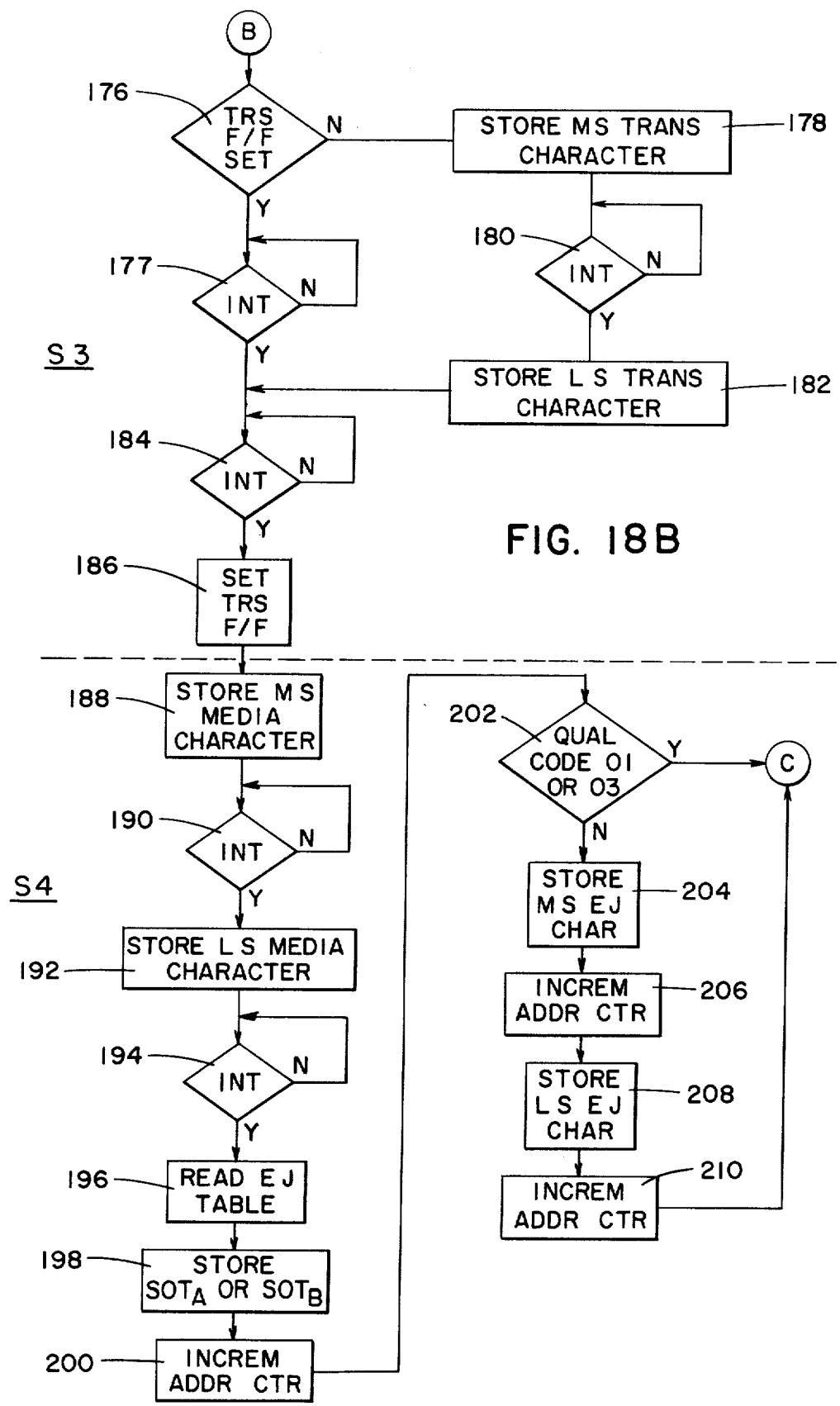
Figure 18C:
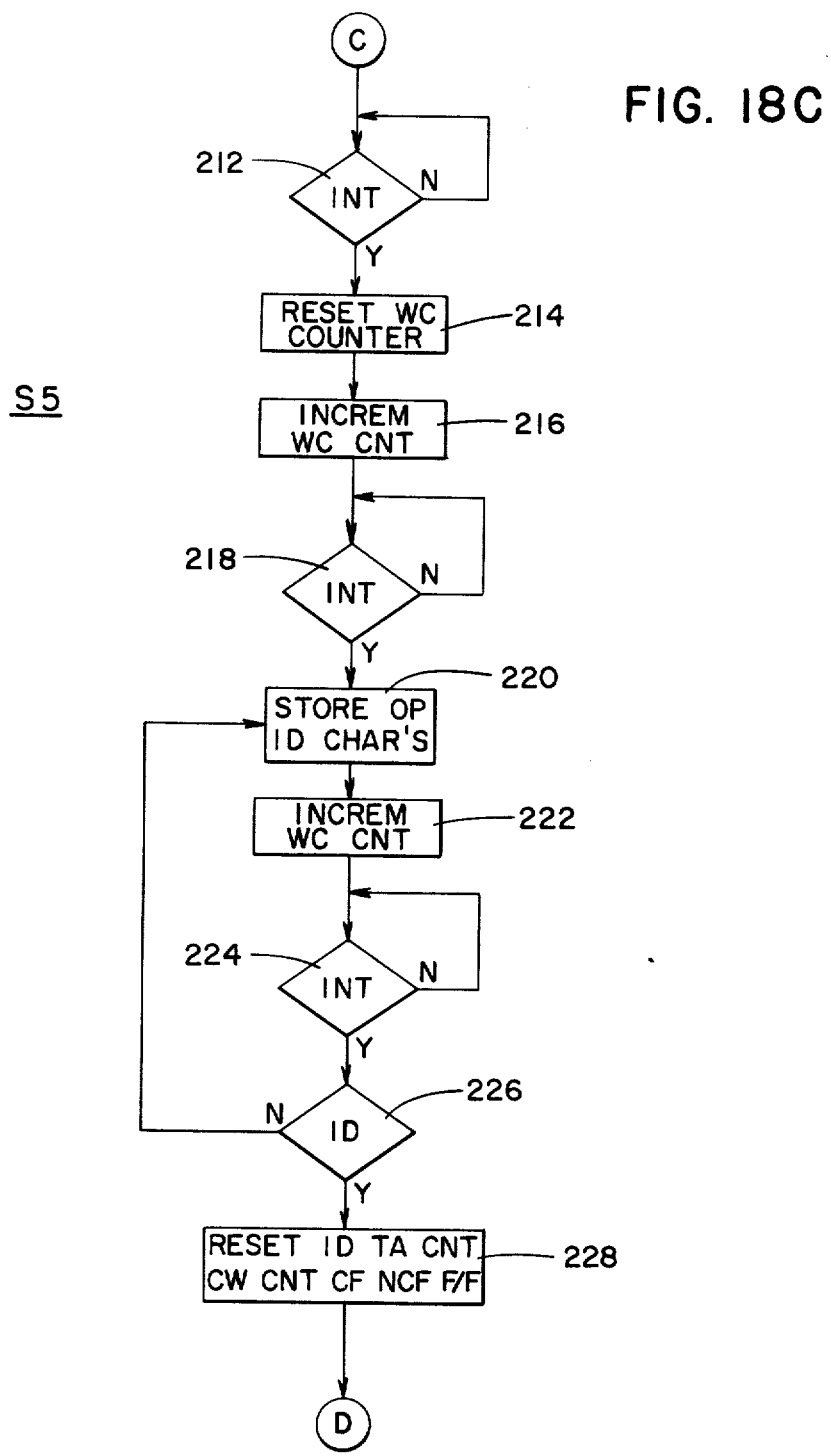
Figure 18D:
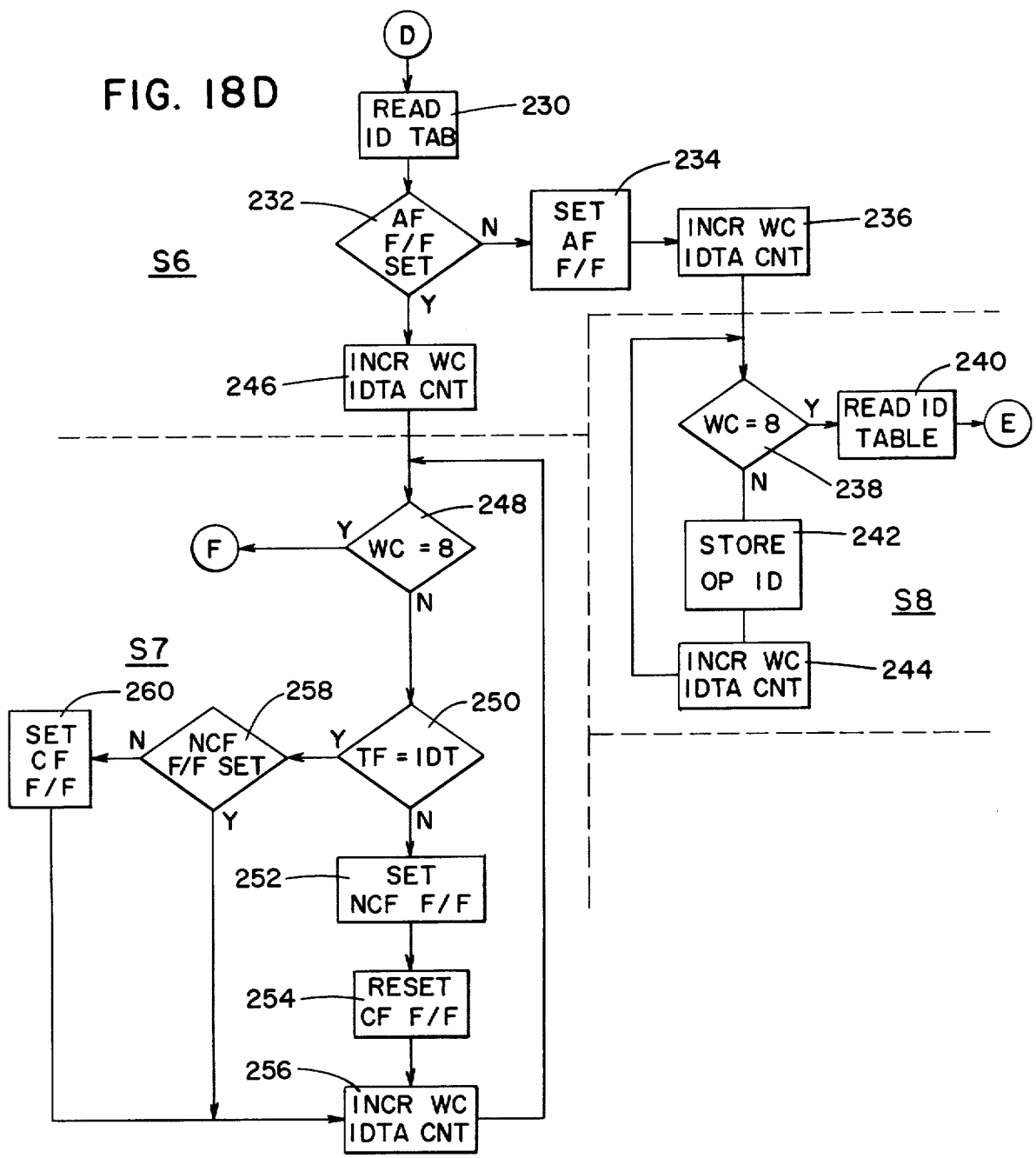
Figure 18E:
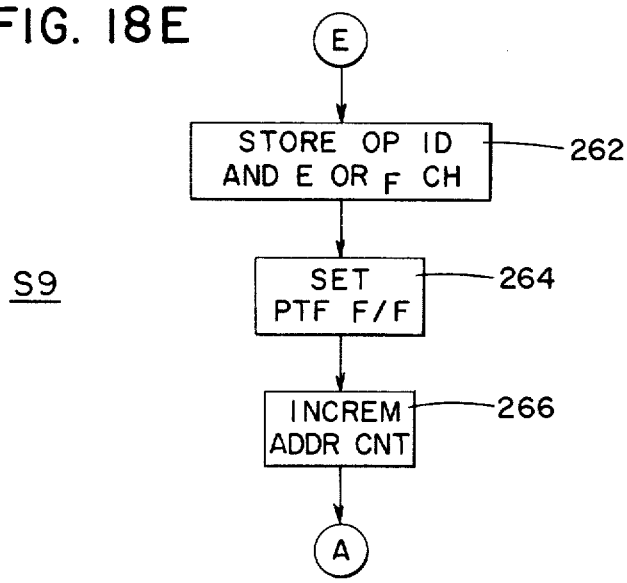
Figure 18F:
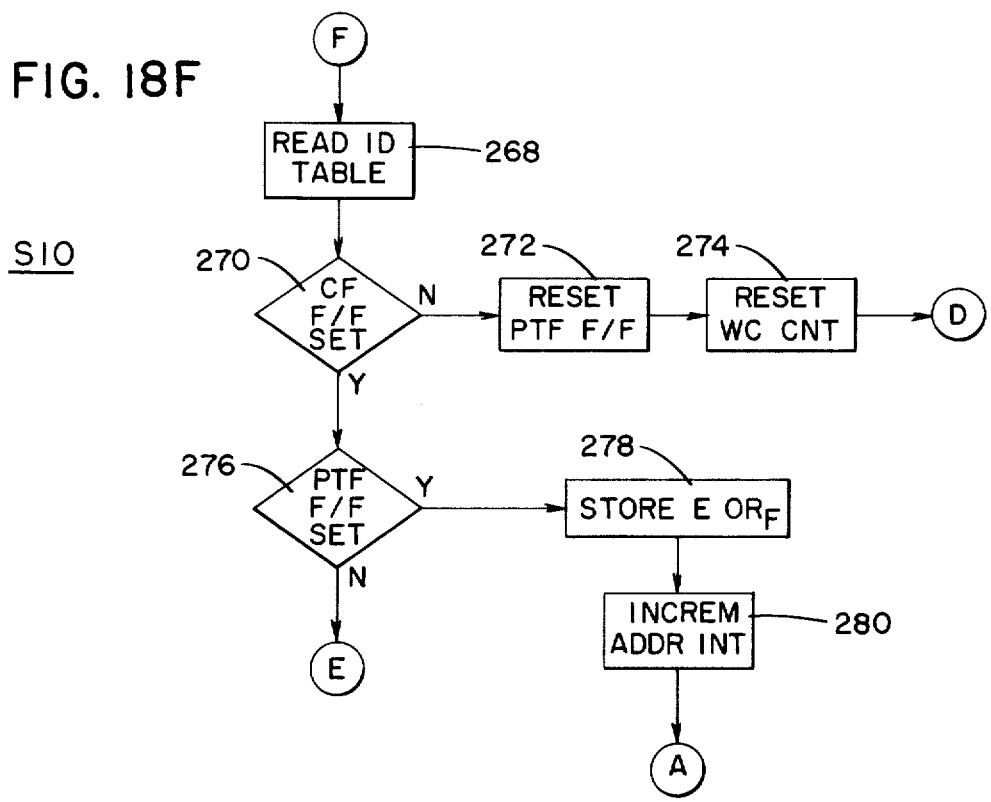
Figure 19:
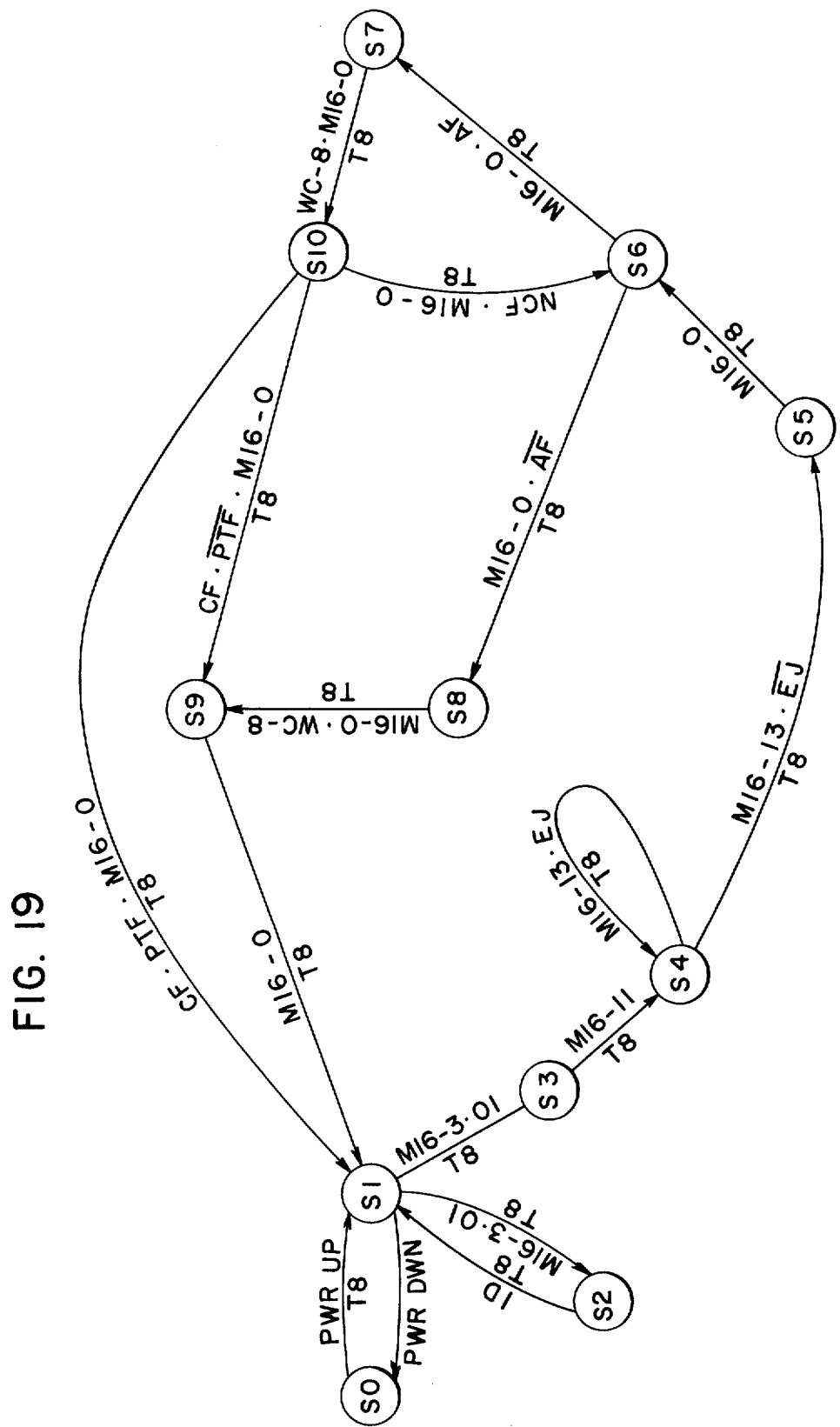
FIG. 19 is a state diagram of the operation of the preferred embodiment.

Referring to FIGS. 15A and 15B there is shown in detail the logical elements of the sequencer 60 (FIG. 9) which includes four conventional LS 107 J-K flip-flops 144 whose outputs are transmitted to a conventional 4-16 output 74154 multiplexer 146 which outputs in sequence ten control signals S0–S10 for transmission to the timing control 62 over cable 148 which effects the outputting in a predetermined sequence of the timing control signals TC for operating the data compressor in states 0–10 as illustrated in FIG. 19 and in a manner that will be described more fully hereinafter. The outputs of the multiplexer 146 are labeled in FIG. 15A in hexadecimal code which is the code used to represent the data characters on the present system. As further shown in FIGS. 15A and 15B, the sequencer 60 includes an array of logical gates which operate in a well-known manner and which receive signals from the logic blocks disclosed in FIG. 9 for enabling the orderly operation of the data compressor 32. The identification of the various input signals to the sequencer 60 will be described more fully in conjunction with the description of the operation of the data compressor 22 (FIG. 1) with respect to the flow diagrams shown in FIGS. 18A–18F inclusive.

The flow diagrams of FIGS. 18A–18F inclusive will now be described in conjunction with the state diagram of FIG. 19 which illustrates the operation of the data compressor 22 with respect to the presence of the various counts of the M16 counter 58, the presence of clock pulse T8 and various other control signals generated as part of the orderly operation of the data compressor 32.

Referring to FIG. 18A, the data compressor 22 will be in an idle state (block 150) (state 1, FIG. 19) with the bus monitor 48 (FIG. 9) monitoring the status decoder 50 (block 152) to see if a signal has been received from the communication control unit 28 (FIG. 1) indicating that the central processor has been disabled. The compressor 22 will stay in this loop as long as the decoder 50 indicates that the central processor is still receiving data from the terminal. When the status decoder 50 indicates that the central processor has been disabled, it will generate an interrupt which notifies the compressor (block 156) of such a condition. The compressor 22 will then monitor the output of the register 52, checking for the presence of the character IC (block 158) which indicates the start of the header portion 38 (FIG. 2) of the message 36. If the character sensed is not IC, the compressor will go back to point A (block 154) until it detects the character IC. This detection occurs in the character decoder 82 (FIG. 9) which sets the IC flip-flop 98 outputting the control signal IC to the M16 counter 58 which outputs count 1 (FIG. 8). The compressor will then check for the next interrupt (block 160) indicating that the control character 00 is now stored in the register 52. The compressor 22 will ignore the character 00 and check for the next interrupt (block 162) indicating that the next character, MSG CNT is stored in the register 52. The compressor will check the MSG CNT character for a 01 indicating that it is the first message of the current transaction operation (block 164). If the character is not 01, but some other number indicating that another message 36 having the same header portion 38 of the same transaction has already been compressed by the compressor 22 and therefore this header portion 38 is redundant and can be ignored, the compressor will go into state 2 (FIG. 19) and check the interrupts (block 166) until it detects the character ID (block 168) indicating the end of the header portion 38 of the current message. The compressor will then leave state 2 (FIG. 19) and return to point A (block 154) in state 1 to check for the header portion 38 of the next message 36 (FIG. 2).

If the compressor 22 detected the character 01 in the MSG CNT field, the compressor will go to state 3 (FIG. 19) by checking for the next interrupt signal (block 170). Upon detecting the next interrupt signal indicating the next character is being outputted by the register 52 over cable 74 (FIG. 9), the compressor will increment the M16 counter 58 by 1 (block 172) and this sequence of events will be repeated until the counter reaches the count of 9 (block 174). Referring to FIG. 7, it will be seen that by incrementing the M16 counter to a count of 9, the control field character C$\phi$, the store number characters, and the terminal number characters will be ignored, since this data can be determined without referring to the message 36 and is the same for each header portion 38 generated by the terminal device 20.

At count 9, the compressor will check (block 176) to see if the TRS flip-flop 79, located in the transaction register 78 (FIG. 9), has been set indicating that the first transaction character has been stored in the transaction register 78. If the flip-flop 79 has not been set, the compressor will store the most significant transaction character (block 178) in the transaction register 78 (FIG. 9) and then wait for the next interrupt (block 180) at which time the M16 counter 58 will output count 10. Upon receiving the next interrupt which indicates that the second transaction character is being outputted from the register 52 (FIG. 9), the compressor 22 will store the second or least significant transaction character (block 182) in the transaction register 78; wait for the next interrupt (block 184) and then set the TRS flip-flop 79 (block 186). The setting of the TRS flip-flop 79 flags the compressor that the transaction number of the first message compressed by the data compressor 32 is already stored in the transaction register 78, and that all the transaction numbers of all subsequent messages can be ignored, since the data expander 34 (FIG. 1) need only know the transaction number of the first message compressed to determine the transaction numbers of each of the subsequent messages compressed by the data compressor since the numbers are in consecutive order. Thus, in the case of the second message transmitted to the data compressor 22, the compressor upon checking the TRS flip-flop 79 to see if it is set (block 176) and finding that it is set, will then wait for the next interrupt (block 177) indicating the presence of the least significant transaction character in the register 52. The compressor 22 will ignore this interrupt and then check for the next interrupt (block 184) indicating the storage of the first or most significant media character in the register 52. The M16 counter 58 will output count 11 at this time. Since the TRS flip-flop 79 is already set, the compressor will enter state 4 (FIG. 19), which occurs when the M16 counter 58 (FIG. 9) is at count 11 and clock pulse T8 (FIG. 11) has been generated (FIG. 19). At count 11, the compressor 22 will store (block 188) the most significant media character in the media register 76 (FIG. 9) and then wait for the next interrupt (block 190).

Upon the occurrence of the next interrupt which increments the M16 counter 58 to output count 12, the compressor 22 will store the least significant media character (block 192) in the Media register 76 (FIG. 9) and wait for the next interrupt (block 194) which indicates that the Qual code character is being outputted from the register 52 (FIG. 9). The compressor 22 will read the EJ table 80 (FIG. 12) (block 196) using the Qual code character (column 83) as an address and store the corresponding format control character $SOT_A$ or $SOT_B$ (block 198) in the field 47 (FIG. 8) of the compressed data record 46 (FIG. 8) stored in the storage unit 32 (FIG. 9), increment (block 200) the address counter 134 (FIG. 9) and check the Qual code character for either a 01 or 03 (block 202). As described previously, if the Qual code character is either 01 or 03, the storing of the format control character $SOT_A$ or $SOT_B$ with no bits located in the electronic journal code field 48 of the compressed data record 46 (FIG. 8) enables the expander 34 (FIG. 1) to reconstruct from the compressed data the proper Qual code. If the Qual code character was not 01 or 03, the compressor 22 will store the most significant EJ character (block 204) in the RAM storage unit 32 (FIG. 1), increment (block 206) the address counter 134 (FIG. 9), store the least significant EJ character (block 208) in the storage unit 32 and again increment (block 210) the address counter 134 (FIG. 9). The incrementing of the address counter 134 will result in the EJ flip-flop 81 outputting a signal $\overline{EJ}$ to the sequencer 60. As shown in FIG. 19, the generation of the signal $\overline{EJ}$ together with the count 13 of the M16 counter 58 results in the compressor entering state 5 at Point C (FIG. 18B and 18C).

Referring to FIG. 18C, it will be seen that the compressor 22 upon entering state 5, will wait for the next interrupt (block 212) indicating that the next character SEQ (FIG. 7) in the header portion 38 is now being outputted by the register 52. The output of the M16 counter 58 will at this time be at count 14. The compressor 22 resets (block 214) the WC counter 108 (FIG. 9); increment the WC counter (block 216) and waits for the next interrupt (block 218) at which time the M16 counter 58 will output count 15. The generation of this next interrupt indicates that the most significant operator ID character is now being outputted from the register 52 (FIG. 9) over cable 74 through multiplexer 84 to the temporary file 106 (FIG. 13) of the ID table 104 (block 220). The compressor 22 then increments the WC counter 108 (block 222) and waits for the next interrupt signal to occur (block 224) which increments the M16 counter 58 to output count 16. When this interrupt signal occurs, the compressor will check the character being outputted from the register 52 to see if it is an ID character (FIG. 7) indicating the end of the header portion 38 (block 226). If the character is not an ID character, the compressor will go back to block 222 and store that character which in this case would be the next operator ID character. The word counter 108 is then incremented to provide the address of the next operator ID character for storage in the temporary file 106 (FIG. 13). This sequence of events will continue until all seven operator ID characters are stored in the temporary file 106, at which time, the compressor will detect the end of header character ID, and then reset (block 228) the WC counter 108 and the IDTA counter 112 (FIG. 9) preparatory to comparing the operator ID character now stored in the temporary file 106 with the last operator ID stored in the ID table 104 (FIG. 13). In addition to counters 108 and 112, the CF flip-flop 122 and the NCF flip-flop 124 located in the comparator 114 (FIG. 9) will be reset.

Referring to FIG. 13, it will be seen that the first bit in the 0 word location in the first field in the ID table 104 is labeled AF, which is the output of the flip-flop 105 (FIG. 9) and which is set to a logical one whenever its associated record field has stored therein an operator ID. The first bit in the eighth or last word location of the same field is labeled PTF and is the output of the flip-flop 107 (FIG. 9) and is set to a logical one if this is the last field in the ID table 104 in which the seven 8-bit characters of an operator ID is stored. The function of the flip-flops 105 and 107 will be disclosed more fully hereinafter in checking if the operator ID of the current header portion 38 is the same as the previous header portion 38.

Referring to FIG. 18D, the compressor 22 will read (block 230) the first record 103 in the ID table 104 (FIG. 13) and the AF flip-flop in that field is checked to see if it is set (block 232). At this time, the compressor will enter state 6 (FIG. 19). If the AF flip-flop 105 in the first field is not set, indicating an empty record, and which normally occurs when the first header portion 38 is processed by the compressor 22, the compressor 22 will set (block 234) the AF flip-flop 105 (FIG. 9) in that field and increment (block 236) the WC counter 108 and the IDTA counter 112 (FIG. 9) whose outputs will provide the address of the first character or word location in the first record 103 of the ID table 104 (FIG. 13). The compressor 22 will check the output count of the WC counter 108 (block 238) to see if it is at 8, indicating that the seven characters of the operator ID have been stored in the first field or the ID table 104. At this time the compressor enters state 8 (FIG. 19). If the WC counter 108 is not at count 8, the compressor will store (block 242) the operator ID character in the field location whose address in the output count of the counters 108 and 112, and increment (block 244) the WC counter 108 and the IDTA counter 112 to provide the address of the next field location. This process will continue until all seven characters of the operator ID are stored in the first field of the ID table 104. At this time, the output of the WC counter 108 is at 8 (block 238) and the compressor will read (block 240) the ID table to output the operator ID character to the ID register 110 for storage in the field location 51 of the compressed data record 46 (FIG. 8) located in the RAM memory 32 (FIG. 9).

If the compressor 22 upon reading the first record in the ID table (block 230) finds that the AF flip-flop 105 (FIG. 9) in that field is set (block 232) indicating an occupied field, the compressor 22 will increment the WC counter 108 and the IDTA counter 112 (block 246) and check the output of the WC counter 108 for the presence of an 8 count (block 248) which would indicate that the operator ID characters of the current header portion 38 have been compared with the operator ID characters stored in the first field of the ID table 104. At this time, the compressor enters state 7 (FIG. 19). If the output count of the WC counter 108 is not 8, the compressor 22 will output the current operator ID characters stored in the temporary file 106 to the ID register 110 from which the characters are then transmitted to the comparator 114 which compares (block 250) the current operator ID characters with the characters stored in the first field location of the ID table 104 (FIG. 13). If the comparator 114 finds that the operator ID characters are identical, the compressor will check to see if the NCF flip-flop 124 (FIG. 9) is set (block 258). If the NCF flip-flop 124 is not set, the compressor will set the CF flip-flop 122 (block 260) and increment the WC counter 108 and the IDTA counter 112 (block 256) and then check the output count of the WC counter 108 for the presence of an 8 count (block 248).

If, in comparing the operator ID characters of the current header portion 38 with the operator ID characters stored in the ID table 104, the comparator 114 finds that the operator ID's do not compare, the comparator 114 will set the NCF flip-flop 124 (block 252), reset (block 254) the CF flip-flop 122 and then the processor will increment the WC counter 108 and the IDTA counter 112 (block 256). This sequence of operations will continue until the output of the WC counter 108 is equal to 8, at which time the compressor will read the next record in the ID table 104 (block 268) (FIG. 18F) for comparing the operator ID characters stored in that record with the current operator ID characters stored in the ID register 110 (FIG. 9). At this time the compressor enters state 10 (FIG. 19). The compressor 22 will then check the output of the comparator 114 to see if the CF flip-flop 122 is set (block 270). If the flip-flop 122 is not set, the signal NCF from the flip-flop 124 will be outputted to the sequencer 60 indicating that there is no comparison between the current header operator ID character and the operator ID record stored in ID table (FIG. 13). The compressor 22 resets (block 272) the PTF flip-flop 107 (FIGS. 9 and 13) of the record field in the ID table 104 just compared. The resetting of the PTF flip-flop 107 indicates that the operator ID characters of the current header portion 38 are not equal to the previous field in the ID table just compared. The compressor 22 then resets (block 274) the WC counter 108 in preparation for comparing the operator ID characters of the current header portion 38 with the operator ID characters found stored in the next record field in the ID table 104 (FIG. 1) and will return to state 6 (FIG. 19). This operation of the comparator 114 will continue until the compressor finds a comparison (block 270) (FIG. 18F) between the operator ID characters of the current header portion 38 and one of the operator ID character records 103 in the ID table 104 or it finds a record in which the AF flip-flop 105 (FIGS. 9 and 13) is not set (block 232). This condition indicates this record portion 103 of the ID table 104 is empty and none of the previously compared records compare with the operator ID of the current header portion 38. The current operator ID is then stored in the empty record portion 103 of the ID table 104 and the AF flip-flop 105 will be set (block 234) (FIG. 18D) indicating the last field in the ID table 104 in which an operator ID is stored.

If a comparison is found between the current operator ID characters (block 270) (FIG. 18F) and one of the records 103 in the ID table 104, the compressor 22 must determine if that record contains the operator ID characters of the last header portion 38 processed, in which case the operator ID field 51 in the compressed data record 46 (FIG. 8) is left blank. As described previously, this condition allows the expander 34 (FIG. 1) to reconstruct from the previous header portion the operator ID of the current header portion. If no comparison is found with any of the records 103 in the ID table 104, the compressor 22 will store in the operator ID field 51 of the compressed data record 46 (FIG. 8) four data bits representing the operator ID of the current header portion 38 and the seven characters of the current operator ID in the first unoccupied record 103 of the ID table 104. After finding a comparison (block 270), the compressor 22 will check to see if the PTF flip-flop 107 is set (block 276). If the PTF flip-flop 107 is set, indicating that this record portion 103 in the ID table 104 contains the operator ID characters from the last processed header portion 38, the compressor 22 will skip the operator ID field 51 in the compressed data record 46 (FIG. 8) (block 278) and store the end of word character $EOR_F$ in the memory unit 32 (FIG. 9) outputted from the character encoder 128. The compressor 22 then increments (block 280) the address counter 134 (FIG. 9) before returning into the idle state one (FIG. 19) preparatory to compressing the next portion of the message 36 received by the bus monitor 48.

If the compressor 22 in checking the PTF flip-flop 107 (block 276) finds the flip-flop in a reset condition ($\overline{PTF}$ is a logical one) indicating that the matched operator ID's are not equal to the last header portion 38 processed, the compressor 22 will store (block 262) (FIG. 18E) the last four bits of the operator ID outputted from the ID register 110 and the end of word character $EOR_F$ outputted from the character encoder 128 in the compressed data record 46 (FIG. 8) located in the RAM memory 32. The compressor then sets (block 264) the PTF flip-flop 107 and increments (block 266) the address counter 134 (FIG. 9) before returning to the idle state (point A) preparatory to compressing the next character outputted from the register 52.

Referring to FIG. 8, it will be seen that if the total number of bits in the compressed data record 46 is 8, the expander 34 (FIG. 1) will know that there are no bits in fields 49 and 51 and therefore knows that the transaction was a normal cash or charge transaction depending on the format control character ($SOT_A$ or $SOT_B$) present and further that the operator ID is the same as the operator of the previous transaction. If the number of bits is 12, a new operator ID is specified. If the number of bits is 16, a new electronic journal code is specified and if the number of bits is 20, a new format code and operator ID is specified.

While the present embodiment of the data compressor 22 has been described with respect to the off-line operation of the terminal upon the disabling of the central processor to receive any more data from the terminal, it is obvious that the data compressor can be used in those situations where the total amount of compressed data generated during a day's operation of the terminal can be stored within a memory unit contained in the terminal itself, thereby eliminating any need or expense of the central processor. As shown in FIG. 8, the data compressor can compress the original header portion 38 consisting of up to 176 bits of data to a compressed data reocrd 46 of from 8 to 20 bits, thereby realizing a reduction of up to 8 to 1 in this portion of the message. As was described previously, the compression of the data in the manner disclosed would also result in the elimination of the tax portion 42 (FIG. 2) and the closing portion 44 of the message 36 thereby providing a further reduction in the amount of data required to be stored in the memory unit 32.

While the principles of the invention have now been made clear in the illustrated embodiment, it will be obvious to those skilled in the art that many modifications in structure, arrangements, elements and components can be made which are particularly adapted for specific environments and operation requirements without departing from these principles. The appended claims are therefore intended to cover and embrace any such modifications, within the limits only of the true spirit and scope of the invention.

What is claimed is:

1. In a system for transmitting a plurality of data messages each comprising redundant and non-redundant characters between a data terminal device and a central processor in which a character is considered redundant if the character is the same in succeeding data messages, a data compression apparatus for generating a compressed data record representing the data messages generated as part of a merchandising operation by the data terminal device comprising in combination:

first storage means for storing the characters of the data messages generated by the data terminal devices;

means for generating a plurality of first control signals in response to the disabling of said central processing means and the storing of the data message in said first storage means;

timing control means operated in response to the generation of each of said first control signals to output a plurality of timing control signals;

second storage means for storing data representing a compressed data record;

table look-up means coupled to said first and second storage means and said timing control means for storing a plurality of first non-redundant characters together with an associated one of a plurality of start of compressed data record characters; said table look-up means operated in response to the generation of another of said timing control signals to receive a first non-redundant character from said first storage means for storing in said second storage means one of said plurality of start of compressed data record characters in accordance with the first non-redundant character received from said first storage means, said start of compressed data record character also contains information representing the first non-redundant character;

third storage means coupled to said first storage means for storing a character of the first data message in response to the generation of one of said timing control signals;

means coupled to said first and third storage means for comparing the corresponding character of each succeeding data message with the character stored in said third storage means to determine if the character is redundant or non-redundant; and control means responsive to the operation of said comparing means for storing in said second storage means the non-redundant character of the data message when a comparison is not found.

2. The data compression apparatus of claim 1 in which said timing control means includes:

counter means for generating consecutive counts in response to the generation of each of said first control signals, each count representing the position of a character in the data message;

and sequencing means responsive to a predetermined count generated by said counter means for outputting said timing control signals for processing the character being outputted by said outputting means, said sequencing means being logically constructed to stop outputting said timing control signals when responding to those counts of said counter means representing the position of known redundant characters of said data message.

3. The data compression apparatus of claim 2 which further includes fourth storage means enabled by said sequencing means for storing a second non-redundant character which varies with each second non-redundant character of each succeeding data message by a constant, and means responsive to the storage of said second non-redundant character for disabling said fourth storage means from storing a second non-redundant character of a subsequently-generated data message.

4. The data compression apparatus of claim 3 which further includes means for generating an end-of-record character in response to the output of a predetermined count from said counter means to said sequencer means, said end-of-record character being stored in said second storage unit to signify the end of the compressed data record.

5. In a data terminal device which outputs a plurality of digital messages each including a plurality of redundant and non-redundant data characters in which a character is considered redundant if the character is the same in succeeding data messages, a data compression apparatus for compressing each of said digital messages comprising:

means for serially outputting each character of the digital message;

means for generating a first control signal in response to the outputting of each character of the digital message;

counter means operated in response to the generation of each of said first control signals to output a predetermined count;

timing control means coupled to said counter means for outputting a plurality of second control signals in response to the outputting of each count of the counter means;

first storage means for storing a compressed data record;

table lookup means storing a plurality of first non-redundant characters together with an associated one of a plurality of start of compressed data record characters coupled to said outputting means, said timing control means and said first storage means for receiving a first non-redundant character from said outputting means when enabled by one of said second control signals, said table lookup means outputting one of a plurality of a start-of-record characters to said first storage means in accordance with the first non-redundant character received, said start-of-record characters indicating the start of the compressed data record in addition to the first non-redundant character received;

second storage means operated by one of said second control signals for storing a second non-redundant character of a digital message;

third storage means operated by one of said second control signals and coupled to said outputting means for storing a second non-redundant character of each succeeding digital message received from said outputting means;

compare means coupled to said second and third storage means for comparing the second non-redundant characters stored in said second and third storage means;

and first bistable means coupled to said compare means and operable in response to the finding of no comparison by said compare means for enabling said first and second storage means to store the second non-redundant character outputted from said outputting means.

6. The data compression apparatus of claim 5 which further includes second bistable means coupled to said compare means and operable in response to the finding of a comparison by said compare means for disabling said first and second storage means from storing the second non-redundant character outputted from said outputting means.

7. The data compression apparatus of claim 6 which further includes a third bistable means and a fourth storage means coupled to said outputting means and said timing control means and enabled by one of said second control signals for storing a third non-redundant character of a digital message outputted from said outputting means, said third non-redundant character varies with the third non-redundant character of each succeeding digital message by a constant and said third bistable means operable in response to the storage of the first occurring third non-redundant character in said fourth storage means for disabling said fourth storage means from storing a third non-redundant character of a succeeding digital message.

8. In a system for transmitting a plurality of data messages between a data terminal device and a central processor, said data messages including a plurality of characters representing redundant data in which a character is considered redundant if the character is the same in succeeding data messages and non-redundant data such as transaction data, merchandise-coded data and an operator ID data, an apparatus for compressing said data message comprising in combination:

means for serially outputting each data character of the data message;

means for generating a first control signal upon the outputting of each data character;

means for generating an identifying signal upon detecting the start of the first character in the data message;

binary counter means responsive to the generation of said identifying signal and said first control signal for generating a predetermined binary count;

means for generating a plurality of clock pulses;

timing control means operated in response to the generation of each of said binary counts and said clock pulses for outputting a plurality of second control signals, said timing control means include sequencing means for disabling said timing control means from generating said second control signals in response to the outputting of certain of said redundant data characters by said outputting means;

first storage means for storing a compression data message;

and table lookup means coupled to said outputting means, said first storage means and said timing control means for receiving a merchandise-coded data character when enabled by one of said second control signals, said table lookup means includes second storage means for storing a plurality of start-of-record characters each representing a merchandise-coded character, said table lookup means outputting to said first storage means one of said start-of-record characters in accordance with the merchandise coded character received wherein the start-of-record character stored in said first storage means represents the start of the compressed data message and the merchandise coded character outputted by said outputting means.

9. The data compression apparatus of claim 8 which further includes:

a third storage means coupled to said outputting means for storing the operator ID character of the previously-generated data message;

a fourth storage means coupled to said outputting means for storing the operator ID character received from said outputting means;

compare means coupled to said third and fourth storage means for comparing the operator ID characters stored in said third and fourth storage means;

and a first two-state logical device coupled to said compare means and said sequencing means and settable to a state in response to the finding of a no comparison by said compare means thereby enabling said timing control means to output a second control signal to said first and third storage means enabling the operator ID characters outputted by said outputting means to be stored in said first and third storage means.

10. The data compression apparatus of claim 9 which further includes a second two-state logical device coupled to said timing control means and settable in response to the finding of a compression by said compare means enabling said timing control means to output one of said second control signals to said first and third storage means disabling said first and third storage means from storing the operator ID character outputted by said outputting means.

11. The data compression apparatus of claim 10 which further includes a data register coupled to said outputting means and said timing control means and enabled by one of said second control signals generated by said timing control means in response to the outputting of a predetermined count from said binary counter means whereby the data register will store the transaction data outputted by said outputting means, said transaction data comprising one of a plurality of consecutive numbers identifying consecutive data messages, and a two-state logical device settable to a state upon the storing of the transaction data in said data register for disabling said data register from storing the transaction data of a subsequently-generated data message.

12. A method for use in an on-line data processing system in which data messages are transmitted from a data terminal device to a central processor of compressing redundant and non-redundant characters of a data message generated in a data terminal device upon the disabling of the central processor in which a character is considered redundant if the character is the same in succeeding data messages and said data terminal includes a storage table in which is stored a plurality of first non-redundant characters and an associated one of a plurality of different start-of-record characters comprising the steps of:

sensing the disabling of the central processor;

interrupting the data message transmitted from the terminal device upon sensing the disabling of the central processor;

storing all redundant and non-redundant characters of the first interrupted data message;

comparing all redundant characters of each data message with the redundant characters of a previous data message;

eliminating all redundant characters of the data message upon finding a match with the corresponding character of a previous data message;

comparing a first non-redundant character of the data message with the stored plurality of first non-redundant characters in said storage table;

generating one of a plurality of different start-of-record characters in accordance with the matching of said first non-redundant character;

storing in a first storage unit the start-of-record character generated as the first character of the compressed data record, the start-of-record character also representing the matched first non-redundant character;

storing in a second storage unit a second non-redundant character of the first data message received which varies with a corresponding second non-redundant character in each succeeding data message by a constant value in said first storage unit as a character in said compressed data record;

and disabling said second storage unit from receiving any subsequently received second non-redundant characters.

* * * * *